United States Patent [19]

Iketani

[11] Patent Number: 4,779,073
[45] Date of Patent: Oct. 18, 1988

[54] APPARATUS FOR 3B-2T CODE CONVERSION

[75] Inventor: Akira Iketani, Higashiosaka, Japan

[73] Assignee: Matsushita Electric Industrial Co., Ltd., Kadoma, Japan

[21] Appl. No.: 41,502

[22] Filed: Apr. 23, 1987

[30] Foreign Application Priority Data

Apr. 24, 1986 [JP] Japan .................................. 61-95373

[51] Int. Cl.$^4$ ............................................. H03M 7/00
[52] U.S. Cl. ......................................... 341/55; 375/17; 375/19
[58] Field of Search .................. 340/347 DD; 375/17, 375/19

[56] References Cited

U.S. PATENT DOCUMENTS 4,003,041 1/1977 Van Duuren et al. ............ 375/19 X
4,408,189 10/1983 Betts et al. ......................... 375/19 X Primary Examiner—William M. Shoop, Jr.
Assistant Examiner—Richard K. Blum
Attorney, Agent, or Firm—Cushman, Darby & Cushman

[57] ABSTRACT

An apparatus converting three bits of binary data ($B_1$, $B_2$, $B_3$) into two ternary symbols ($T_1$, $T_2$), in which even numbered pars of the ternary symbols ($T_1$, $T_2$), where ($T1=T2$), are replaced by a pair of ternary symbols ($T'_1$, $T'_2$) which do not correspond to any of the three bits of binary data ($B_1$, $B_2$, $B_3$). The replacement occurs when the respective symbols in a respective pair of ternary symbols ($T_1$, $T_2$) are in the same ternary level; hence, a run-length of the same symbol can be restricted to four or less. Furthermore, the digital sum variation (DSV) is controlled in every synchronous block which is composed by the above-mentioned replaced output, thereby allowing a 3B-2T code which does not contain a DC component to be obtained. Moreover, inversion or noninversion of the synchronous pattern can be easily determined by distinguishing whether control of the DSV is applied or not to the synchronous block.

3 Claims, 9 Drawing Sheets

APPARATUS FOR 3B-2T CODE CONVERSION

FIELD OF THE INVENTION AND RELATED ART STATEMENT

1. Field of the Invention

The present invention relates to a code conversion apparatus for generating a ternary code which is utilized for transmission and recording of a digital signal.

2. Description of the Related Art

A block arrangement as shown in FIG. 11 is conventionally used in order to record a digital signal. In the block arrangement, a data portion which is designated by "information" is added to a SYNC portion which is designated by "synchronous pattern". The synchronous pattern is a synchronous signal for designating a head of the block, and the block is called a SYNC block. The block identifies a group of data which is punctuated every predetermined number of bits. Generally, the SYNC block is converted to a channel code having characteristics which are suitable for use with a recording and playback system, and the SYNC block is transmitted and is recorded.

At the present time, various channel codes are used, and one of them is a 3B-2T code which is a ternary code. The 3B-2T code is obtained by conversion of three bits of binary data ($B_1$, $B_2$, $B_3$) ($B_i$: 0, 1, i=1–3) which is composed by three bits to a pair of symbols ($T_1$, $T_2$) ($T_i$: 0, 1, 2, i=1, 2) which are composed by ternary values.

A code conversion table for generating the 3B-2T code is shown in Table 1. Referring to Table 1, eight pairs of two symbols ($T_1$, $T_2$) which are selected from nine pairs thereof are made to correspond one-to-one to eight pairs of bit patterns which are composed by three bits of binary data ($B_1$, $B_2$, $B_3$). Hence, symbol patterns which are composed of two symbols corresponding to the bit patterns which are composed of three bits are formed by one-to-one correspondence.

TABLE 1

| No. | 3B $B_1$ | $B_2$ | $B_3$ | 2T $T_1$ | $T_2$ |
|---|---|---|---|---|---|
| 1 | 0 | 0 | 0 | 0 | 0 |
| 2 | 0 | 0 | 1 | 0 | 1 |
| 3 | 0 | 1 | 0 | 0 | 2 |
| 4 | 0 | 1 | 1 | 1 | 0 |
| 5 | 1 | 0 | 0 | 1 | 1 |
| 6 | 1 | 0 | 1 | 1 | 2 |
| 7 | 1 | 1 | 0 | 2 | 0 |
| 8 | 1 | 1 | 1 | 2 | 1 |
| 9 | x | x | x | 2 | 2 |

In the above-mentioned case, when one bit interval is designated by $t_b$, one symbol interval $t_s$ after 3B-2T conversion is shown by the following equation:

$$t_s = 3/2 t_b.$$

Therefore, a symbol frequency $f_s (=1/t_s)$ corresponding to a bit frequency $f_b (=1/t_b)$ is shown by $\frac{2}{3}f_b$, and a frequency bandwidth in 3B-2T code is reduced to $\frac{2}{3}$ of that of the binary code. As a result, when the 3B-2T code is used, since a noise power is low and the symbol interval $t_s$ is longer than the bit interval $t_b$, the 3B-2T code has advantages in that it is resistant to variation in time axis such as peak-shift or jitter over the binary code.

As mentioned above, though the 3B-2T code is fundamentally superior as a channel code, there is a serious problem as shown hereinafter in its practical use.

Since the 3B-2T code contains a DC component, when a signal is transmitted through a rotary-transformer such as in a digital VTR, waveforms in both recording and playback are distorted by the influence of the DC component cut-off characteristics of the rotary transformer. As a result, a symbol error rate in playback is seriously diminished. In the case of the ternary code, on the other hand, if Digital Sum Variation (hereinafter referred to as DSV) which is defined by a difference between a number $N_2$ of symbols "2" and a number $N_0$ of symbols "0" in a sequence of symbols is always definite, the DC component is not contained.

Furthermore, as shown in Table 1, appearance of consecutive like symbols in the conventional 3B-2T code is high in probability, and a self-clocking function for recovering the clock from the playback signal is not realized. This is a serious defect for a channel code to be used for high density recording.

OBJECT AND SUMMARY OF THE INVENTION

An object of the present invention is to provide a 3B-2T code which is suitable for high density recording and which overcomes the above-noted drawbacks of the prior art.

An apparatus for 3B-2T code conversion for converting three binary data bits ($B_1$, $B_2$, $B_3$) to two ternary symbols ($T_1$, $T_2$) in accordance with the present invention additionally comprises:

detecting means for detecting a state wherein continuous occurrence of the same symbol exceeds four, and replacing means for replacing an even numbered pair of ternary symbols ($T_1$, $T_2$, where $T_1 = T_2$), to ternary symbols ($T'_1$, $T'_2$) which do not correspond to any of said three binary data bits ($B_1$, $B_2$, $B_3$) detected by said detecting means.

As a result, a run-length of the same symbols is limited to four and below, and a 3B-2T code which is superior in clock recovery ability is realized.

DESCRIPTION OF THE PREFERRED EMBODIMENT

<First embodiment>

Figure 1:
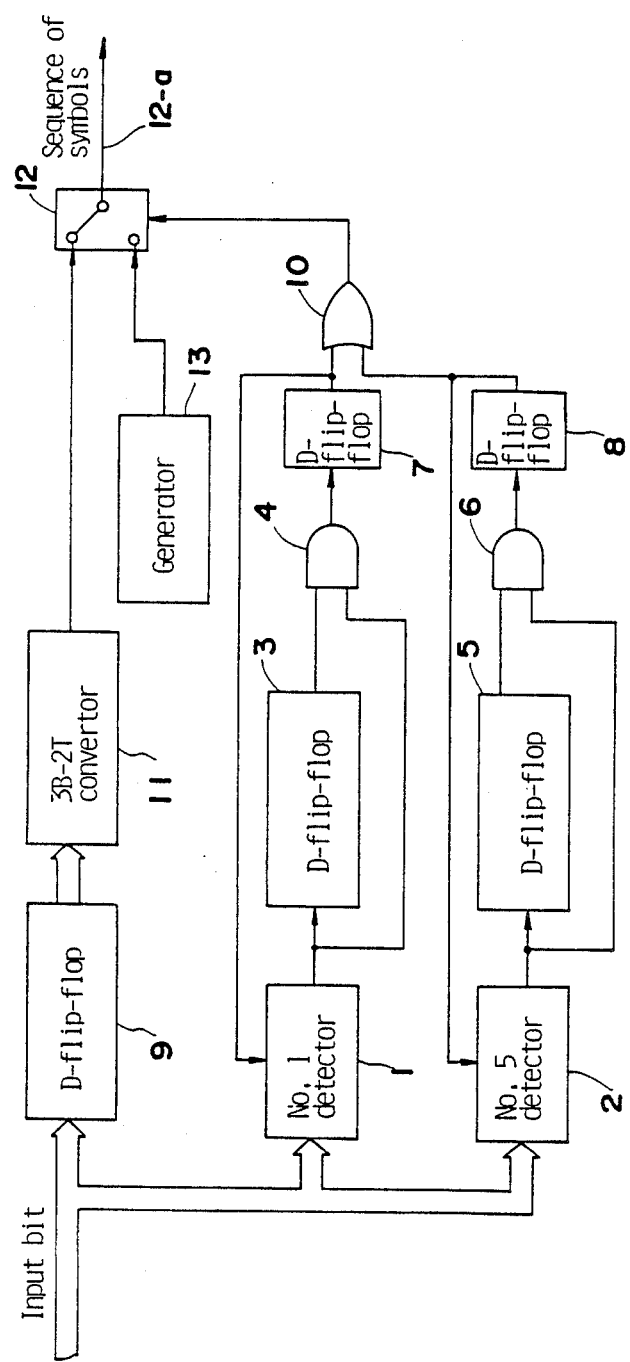
FIG. 1 is a block diagram of a replacing circuit of an embodiment in accordance with the present invention.

The present invention achieves the above-mentioned code conversions using the circuit of FIG. 1. In FIG. 1, when plural pairs of ternary symbols as shown in the first or fifth line in Table 1 exist sequentially, the circuit of FIG. 1 may be used for realizing replacing means wherein even numbered pairs of symbols thereof are replaced by a pair of symbols as shown in the ninth line of Table 1.

Figure 2:
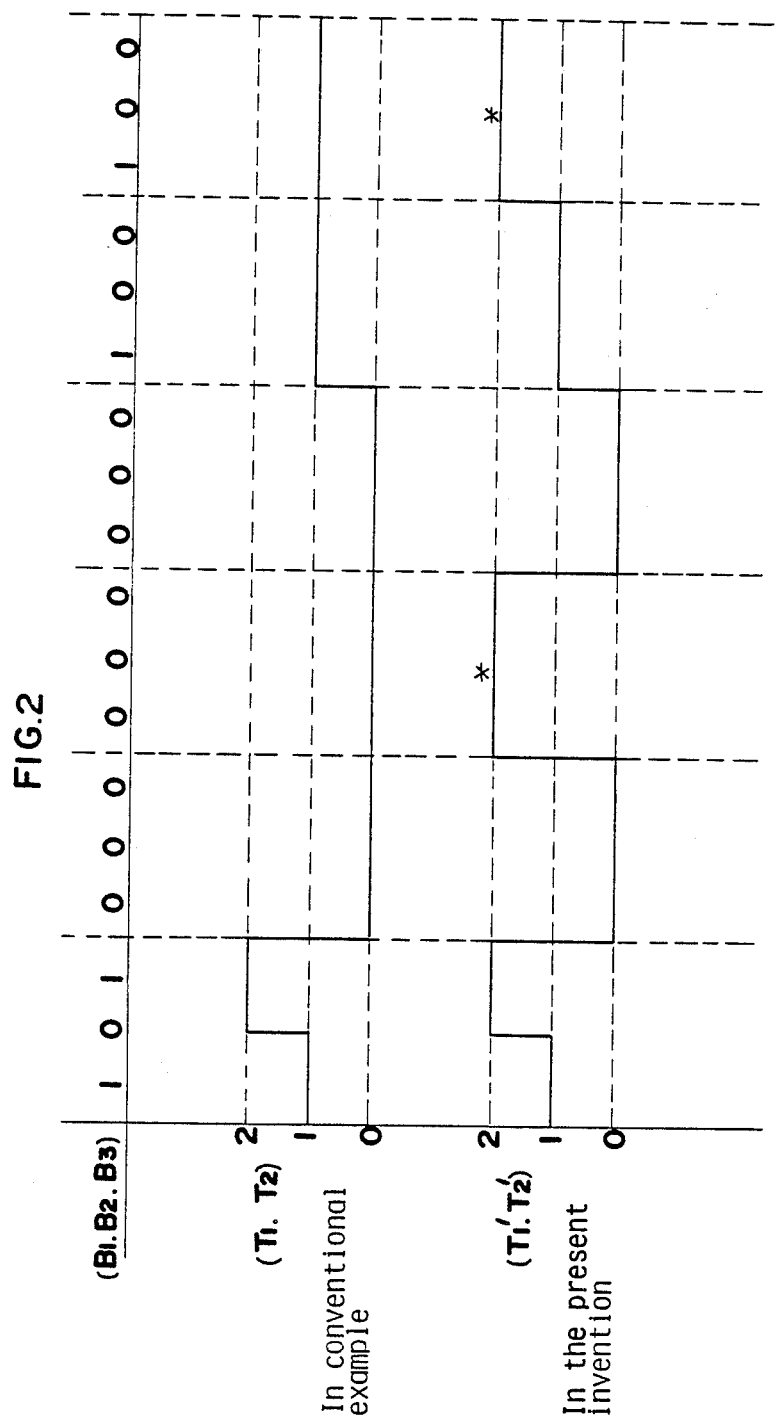
FIG. 2 is a waveform showing a 3B-2T code of the present invention in comparison with the conventional 3B-2T code.

The respective recording waveforms of the conventional 3B-2T code and a new 3B-2T code in accordance with the present invention are shown in FIG. 2. Referring to FIG. 2, level changes can be generated in sections of the new 3B-2T code of the present invention wherein level changes do not exist in the conventional code. In FIG. 2, three binary data bits ($B_1$, $B_2$, $B_3$) designate the input of three binary data bits, two ternary symbols ($T_1$, $T_2$) designating the conventional 3B-2T code which is converted in accordance with Table 1, and two ternary symbols ($T_1'$, $T_2'$) designating the 3B-2T code in accordance with the present invention, where the mark "*" designates portions of the conventional 3B-2T code which are replaced in accordance with the present invention.

Figure 3:
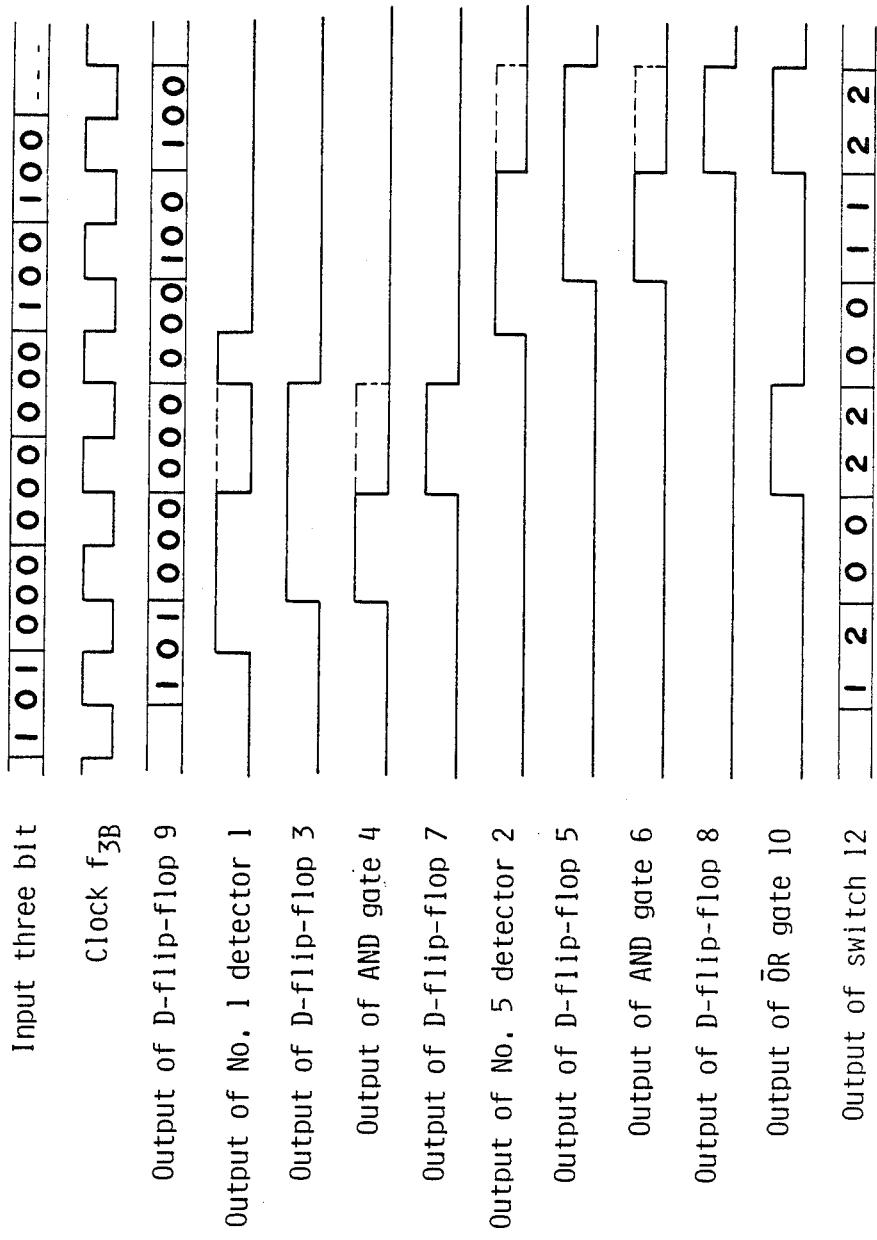
FIG. 3 is a timing chart showing operation of the circuit as shown in FIG. 1.

A block diagram of a circuit for achieving the present embodiment is shown in FIG. 1, and a timing chart showing operation of the circuit of FIG. 1 is shown in FIG. 3. Hereinafter, operation of the circuit as shown in FIG. 1 is elucidated by referring to FIG. 3. The input sequence of three binary data bits to the circuit shown in FIG. 1 is identical with that which is used in the example as shown in FIG. 2 and is shown in the following equation:

($B_1$, $B_2$, $B_3$)=(1, 0, 1), (0, 0, 0), (0, 0, 0), (1, 0, 0), (1, 0, 0).

At first, No. 1 detector 1 outputs an output "1" when three binary data bits ($B_1$, $B_2$, $B_3$) equal to a three bit pattern as shown in the first line of Table 1 is received, and it outputs an output "0" when three binary data bits ($B_1$, $B_2$, $B_3$) do no equal the three bit pattern in the first line of Table 1. No. 5 detector 2 outputs "1" when the three binary data bits ($B_1$, $B_2$, $B_3$) equal the three bit pattern as shown in the fifth line of Table 1, and it outputs output "0" when the three binary data bits ($B_1$, $B_2$, $B_3$) do not equal the three bit pattern as shown in the fifth line of Table 1. Thus, when the three binary data bits ($B_1$, $B_2$, $B_3$) equal the three binary data bits (1, 0, 1), an output of the No. 1 detector 1 is "0" and an output of the No. 5 detector 2 is also "0".

Therefore, an output of AND gate 4 becomes "0" regardless of an output of D-flip-flop 3, which holds the output of No. 1 detector 1 corresponding to the last three binary data bits ($B_1$, $B_2$, $B_3$). In a similar manner, an output of AND gate 6 becomes "0" regardless of an output of D-flip-flop 5, which holds an output of the No. 5 detector 2 corresponding to the last three binary data bits ($B_1$, $B_2$, $B_3$).

After this process, D-flip-flop 7 for holding an output of AND gate 4, D-flip-flop 8 for holding an output of AND gate 6, D-flip-flops 3 and 5 and D-flip-flop 9 for holding the inputted three binary data bits ($B_1$, $B_2$, $B_3$) read and hold respective data which are applied to the respective inputs at a clock $f_{3B}$ of three bits per period. Consequently, an output of D-flip-flop 9 becomes the three binary data bits (1, 0, 1), and the outputs of D-flip flops 3, 5, 7 and 8 become "0". Therefore, an output of OR gate 10 for calculating the logical OR of D-flip flops 7 and 8 also becomes "0".

3B-2T converter 11 is a circuit for conventional 3B-2T conversion for generating two ternary code symbols ($T_1$, $T_2$), in accordance with Table 1 and corresponding to the three binary data bits ($B_1$, $B_2$, $B_3$) from D-flip-flop 9. In the present state, since the three binary data bits ($B_1$, $B_2$, $B_3$) are (1, 0, 1), a two symbol ternary code (1, 2) is produced in the output of 3B-2T converter 11.

Switch 12 selects the output of 3B-2T converter 11 when the output of OR gate 10 is "0", and it selects an output of No. 9 generator 13, which always generates a symbol pattern shown in the ninth line of Table 1, in which the two ternary code symbols ($T_1$, $T_2$) are (2, 2), when the output of the OR gate 10 is "1".

When the three binary data bits ($B_1$, $B_2$, $B_3$) are (1, 0, 1) as mentioned above, since the output of OR gate 10 is "0", the two ternary code symbols (1, 2) from 3B-2T converter 11 are produced at the output 12-a of switch 12.

The second three binary data bit sequence ($B_1$, $B_2$, $B_3$) are (0, 0, 0) is next received. An output of the No. 1 detector 1 becomes "1", but since the output of D-flip-flop 3 is "0", the output of AND gate 4 becomes "0". Furthermore, since the output of No. 5 detector 2 is "0", the output of AND gate 6 also becomes "0".

The outputs of the respective D-flip-flops after reading this new data into respective D-flip-flops at clock $f_{3B}$ are the inputted three binary data bits (0, 0, 0) on D-flip-flop 9, "1" on the D-flip-flop 3, "0" on D-flip-flop 7, "0" on D-flip-flop 5 and "0" on D-flip-flop 8, respectively. Therefore, the output of OR gate 10 becomes "0", and the output of the 3B-2T converter 11 becomes the two ternary code symbols (0, 0) in accordance with Table 1. Thus, the output of the switch 12 becomes the two ternary code symbols (0, 0).

The third three binary data bit sequence ($B_1$, $B_2$, $B_3$) are (0, 0, 0) is next received. Since the output of the No. 1 detector 1 equals to "1" and the output of D-flip-flop 3 equals to "1", the output of AND gate 4 becomes "1". Furthermore, the output of AND gate 6 becomes "0". Therefore, outputs of the respective D-flip-flops after clock $f_{3B}$ become as follows:

D-flip-flop 9: three binary data bits (0, 0, 0),
D-flip-flop 3: "1",
D-flip-flop 7: "1",
D-flip-flop 5: "0",
D-flip-flop 8: "0".

The output of the 3B-2T converter 11 is the two ternary code symbols (0, 0) corresponding to the three binary data bits (0, 0, 0), but since the output of OR gate 10 is "1", switch 12 selects the output of No. 9 generator 13. Thus, the ternary code symbols (2, 2) arise in the output of the switch 12. On the other hand, the output "1" of D-flip-flop 7 resets the output of No. 1 detector 1 to "0":

The fourth three binary data bit sequence ($B_1$, $B_2$, $B_3$) are (0, 0, 0) is next received the output of the No. 1 detector 1 is "1" in its normal state, the output of the No. 1 detector 1 becomes "0" by a reset signal "1" from D-flip flop 7, and the output of AND gate 4 also becomes "0". Furthermore, the output of AND gate 6 becomes "0". A dotted line in FIG. 3 shows a section of "0" which is made by the reset signal, from a state of "1" corresponding to the normal state.

After the above-mentioned process, the outputs of respective D-flip-flops become as follows at clock $f_{3B}$:
D-flip-flop 9: three binary data bits (0, 0, 0),
D-flip-flop 3: "0",
D-flip-flop 7: "0",
D-flip-flop 5: "0",
D-flip-flop 8: "0".

Therefore, the output of OR gate 10 is "0", and the output two ternary code symbols ($\bar{0}$, $\bar{0}$) of 3B-2T converter 11 corresponding to three binary data bits (0, 0, 0) are issued on the output of switch 12.

When the fifth three binary data bit sequence ($B_1$, $B_2$, $B_3$) are (1, 0, 0) is received, the output of No. 5 detector 2 is "1", and since the output of the D-flip-flop 5 is "0", the output of AND gate 6 becomes "0". On the other hand, since the output of No. 1 detector 1 is "0", the output of AND gate 6 also becomes "0".

After this process, the outputs of the respective flip-flops become as follows at clock $f_{3B}$:
D-flip-flop 9: three binary data bits (1, 0, 0),
D-flip-flop 3: "0",
D-flip-flop 7: "0",
D-flip-flop 5: "1",
D-flip-flop 8: "1".

Therefore, the output of OR gate 10 is "1", and the two ternary code symbols (2, 2) from No. 9 generator 13 arise at the output of switch 12. On the other hand, since the output of the No. 5 detector 2 becomes "0" by the reset signal "1" from D-flip-flop 8, even if the next three binary data bits ($B_1$, $B_2$, $B_3$) are (1, 0, 0), replacement by the output of No. 9 generator 13 is not made.

As mentioned above, according to the circuit as shown in FIG. 1 and the timing chart in FIG. 3, only even numbered pairs of plural consecutive symbols as shown in the fifth line of Table 1 are replaced. The same replacement can be applied to the pairs of symbols as shown in the ninth line of Table 1 in a similar manner.

Figure 4:
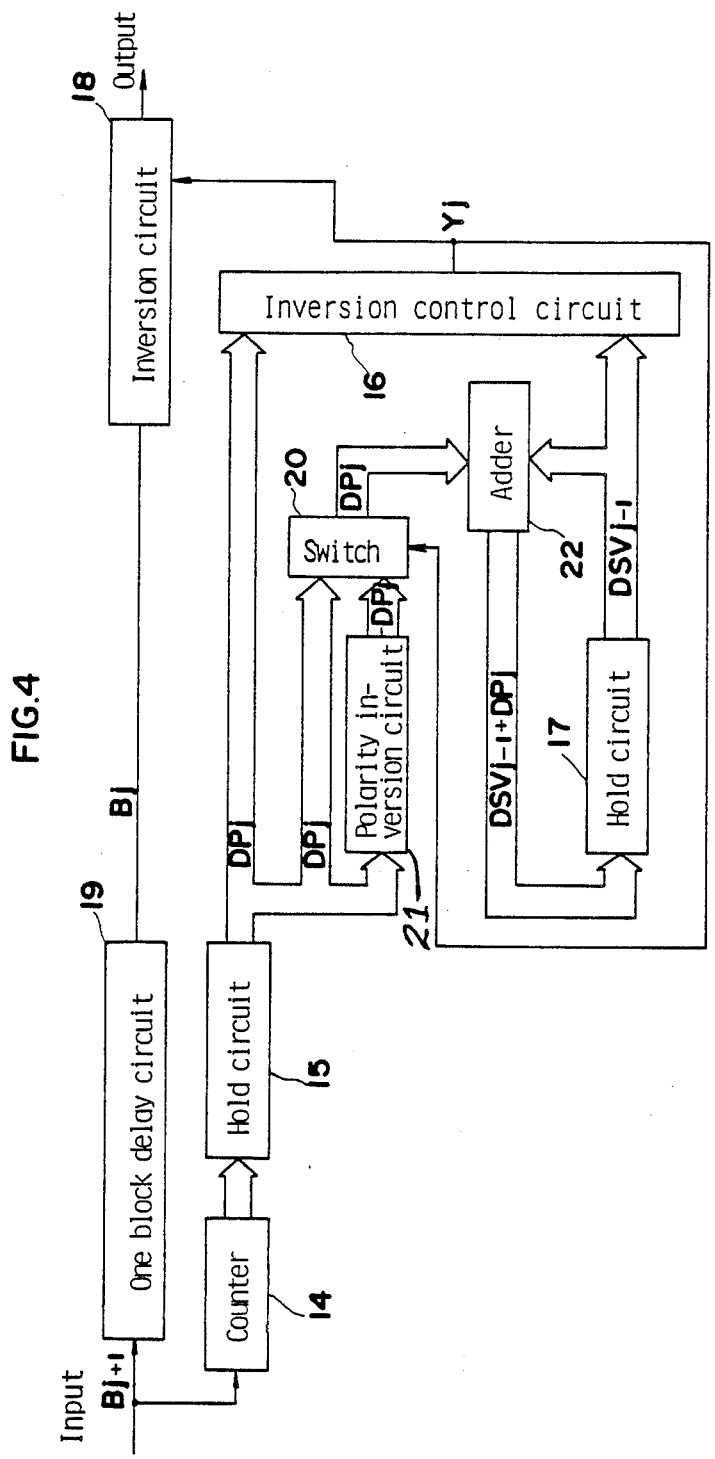
FIG. 4 is a block diagram of a circuit for controlling inversion or noninversion of data which is composed in a block.
Figure 11:
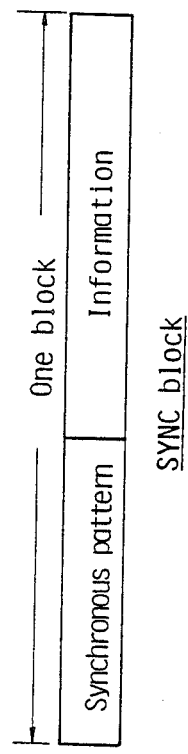
FIG. 11 is a figure showing an arrangement of a SYNC block of the prior art.

A second embodiment of a circuit for code conversion in accordance with the present invention is shown in FIG. 4. The output of the circuit as shown in FIG. 1 is given to the circuit of FIG. 4 in the first embodiment, and it represents a symbol sequence which is composed in a block as shown in FIG. 11.

Counter 14 in FIG. 4 counts a difference DP of the number between symbol "2" and symbol "0" in the input block. Hold circuit 15 holds an output of counter 14 as one unit of every block. An output Y of inversion control circuit 16 equals "1" when all "1" and "0" of the respective blocks which are issued therefrom are reversed, it equals "0" when "1" and "0" are not reversed on the basis of output DP of hold circuit 15 and the output of hold circuit 17, which holds a value of the DSV at the last bit of the last block. Inversions control circuit 16 is operated in accordance with Table 1 in the above-mentioned process.

The output Y of inversion control circuit 16 is applied to an inversion control input of inverter 18. An output of one block delay circuit 19 is applied to another input of the inverter 18. Consequently, data which are composed in a block and which are controlled by inversion (Y=1) or noninversion (Y=0) as to the value of Y are issued to the output of inverter 18.

The output Y of inversion control circuit 16 is simultaneously applied to a select input of switch 20. Switch 20 selects output DP of hold circuit 15 when output Y equals "0" and selects an output of polarity inversion circuit 21 which changes DP to −DP when output Y equals "1". The output DP' of switch 20 (=DP:Y=0, =−DP:Y=1) is added to the output DSV of hold circuit 17 in adder 22, and is read into hold circuit 17. As a result, the DSV is maintained within a definite value without an increase of recording density by use of the circuit as shown in FIG. 4.

Figure 5:
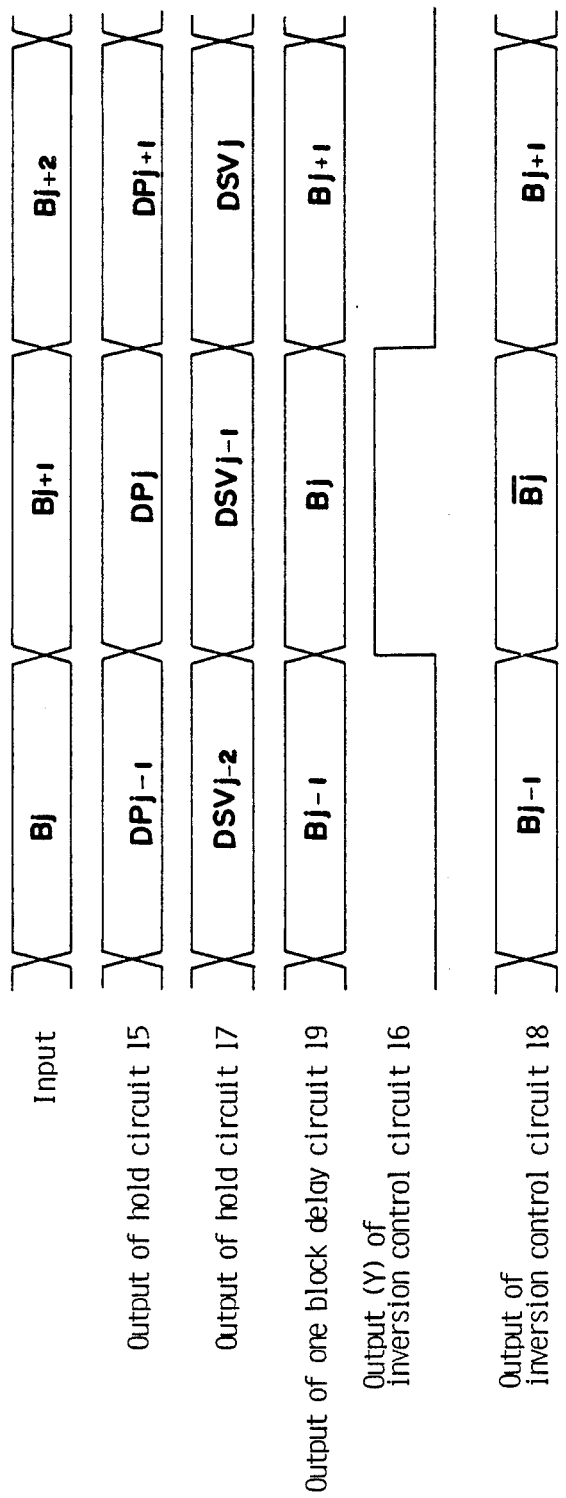
FIG. 5 is a timing chart showing operation of the circuit as shown in FIG. 4.

A timing chart showing operation of the circuit shown in FIG. 4 is shown in FIG. 5. Referring to FIG. 5, expression $B_j$ designates a j numbered block, expression $DP_j$ is a difference of numbers of "2" and "0" in the block $B_j$, expression $DSV_{j-1}$ designates the value of DSV until the last bit of block $B_{j-1}$, and expression $\overline{B_j}$ designates a block wherein all "2"s of the block $B_j$ are inverted to "0" and all "0"s thereof is inverted to "2"s. Referring to FIG. 4 and FIG. 5, data which is composed in a block which maintains DSV in a definite value can be generated.

Figure 6:
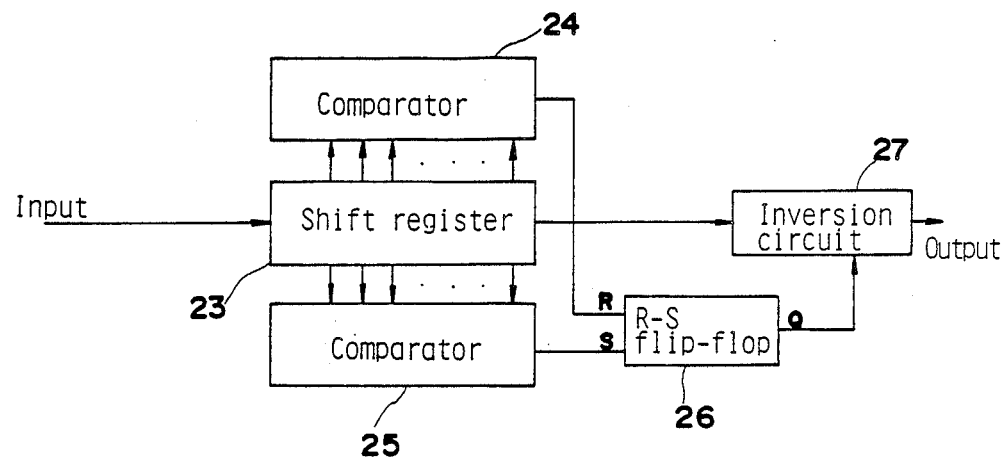
FIG. 6 is a block diagram of a decoding circuit for decoding data which is composed in a block which is controlled by the circuit as shown in FIG. 1.

A decoder of the data which is composed in a block in the above-mentioned process is elucidated hereafter. For example, in a block diagram of the decoder as shown in FIG. 6, comparators 24 and 25 detect whether a synchronous pattern which is read in shift register 23 was inverted. If the reproduced synchronous pattern is not what is inverted, the detection signal of the synchronous pattern (hereinafter referred to as detection signal) is output only from comparator 24. On the contrary, if the detection signal is what is inverted, the detection signal is output only from comparator 25.

The detection signal from comparator 24 is inputted to the R input of R-S flip-flop 26, and the detection signal from comparator 25 is inputted to S input of R-S flip-flop 26. Hence, when the detection signal is output from the output of comparator 24, output Q of R-S flip-flop 26 becomes "0". When the detection signal is output from the output of comparator 25, output Q of R-S flip-flop 26 becomes "1". As a result, data groups which are transmitted through shift register 23 are controlled for inversion (Q=1) or noninversion (Q=0) corresponding to the outpt Q of R-S flip-flop 26. Inverter 27 accomplishes the above-mentioned control. As mentioned above, the data which is composed in a block and which is controlled under its DSV can be correctly decoded by using the decoder in accordance with the present invention as shown in FIG. 6.

This embodiment of the present invention thus can be realized by a very simple and small-scaled circuit as shown in FIG. 4 and FIG. 6. This embodiment thus provides a code without a substantial DC component without the requirement of increasing the recording density. Using such a simple circuit is also superior in practicality.

In the above-described embodiment, though inverse and noninverse processing of the data groups are operated in every block, the operation of inversion or noninversion is accomplished to the respective small blocks which are divided from a block, as well and in order to designate which small block is controlled, a suitable synchronous pattern is selected so that the DSV can be controlled in a smaller unit.

<Second embodiment>

In a circuit of the second embodiment, inversion or noninversion information for a sequence of symbols for holding the DSV within a definite value is inserted in other portions besides the synchronous pattern. In the present embodiment, even if burst error arises in the synchronous pattern, a previous sequence of symbols from playback data before inversion is correctly decoded.

More particularly, when the synchronous pattern detection signal $S_j$ corresponding to block $B_j$ cannot be detected due to symbol error of the synchronous pattern of block $B_j$, the embodiment is effective to jointly use synchronous signal back up means for backing up the synchronous signal back up means for backing up the synchronous signal corresponding to block $B_j$ by using detection signal $S_{j-1}$ of prior block $B_{j-1}$ of block $B_j$ or a detection signal $S_{j+1}$ of following block $B_{j+1}$ of block $B_j$.

Figure 7:
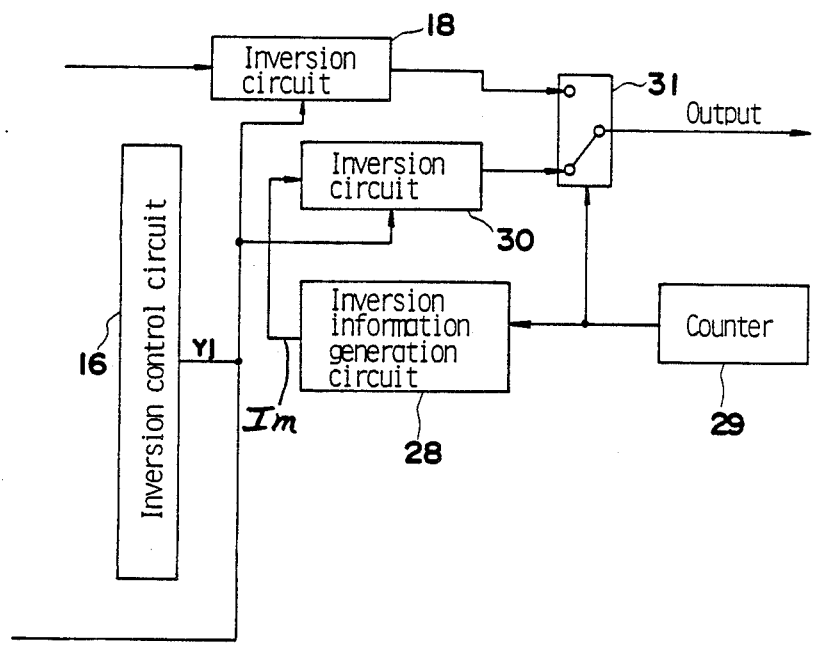
FIG. 7 is a block diagram of the circuit for inserting inversion or noninversion information of the data which is composed in a block.

An example of a circuit block diagram for embodying the third embodiment is shown in FIG. 7. The output of the circuit as shown in FIG. 1 is inputted to the circuit as shown in FIG. 7, and the latter circuit acts to insert inversion or noninversion information of data which is composed in block into a blank space of a block, for example, in a portion of the postamble in addition to the synchronous pattern.

Referring to FIG. 7, inversion information generating circuit 28 generates a symbol pattern of symbols Im which is equal to numbers of "2" and "0", for example, 20202020 (Im=8). Counter 29 outputs "1" during symbols Im from a starting point of the postamble in every block. In that time, and only when the output of the counter 29 is "1", the inversion information generating circuit 28 sequentially outputs a symbol pattern of symbols Im. Therefore, after the finish of issuing of the symbol pattern of symbols Im, the output of counter 29 becomes "0".

On the other hand, the symbol pattern from inversion information generating circuit 28 is controlled for inversion or noninversion of the output Y of inversion control circuit 16 as shown in FIG. 1 in an inverter 30. In other words, the symbol pattern (Y=0) which is output by inversion information generating circuit 28 or a symbol pattern (Y=1), wherein all "2"s of the symbol pattern are inverted to "0"s and all "0" thereof are inverted to "2", are issued from the output of inverter 30.

Switch 31 selects an output of inverter 18 as shown in FIG. 1 when the output of counter 29 is "0", and when the output of counter 29 is "1", selects the output of inverter 30. Hence, the output of inversion information generating circuit 28 or the inverted pattern thereof can be inserted between the starting point of the postamble and symbols Im in the output of switch 31. Furthermore, if the symbol pattern is inserted, a difference of numbers of "2" and "0" in the block can be held at a constant value, because a condition for inversion or noninversion of the block is maintained by selection of the symbol pattern which has the same number of "2"s and "0"s as a symbol pattern which is generated in inversion information generating circuit 28.

<Third embodiment>

The present embodiment relates to a decoder for correctly decoding a previous sequence of symbols before inversion control by the playback data, and additionally to a decoder using a synchronous signal protection means as described hereinafter.

Namely, in the synchronous signal protection means of the present invention, when synchronous pattern detecting signal $S_j$ corresponding to the block $B_j$ cannot be detected due to a symbol error in the synchronous pattern of block $B_j$, a synchronous signal to the block $B_j$ is backed up by using a detecting signal $S_{j-1}$ of a block $B_{j-1}$ which is immediately preceding the block $B_j$ or a detecting signal $S_{j+1}$ of a block $B_{j+1}$ which is following the block $B_j$.

Figure 8:
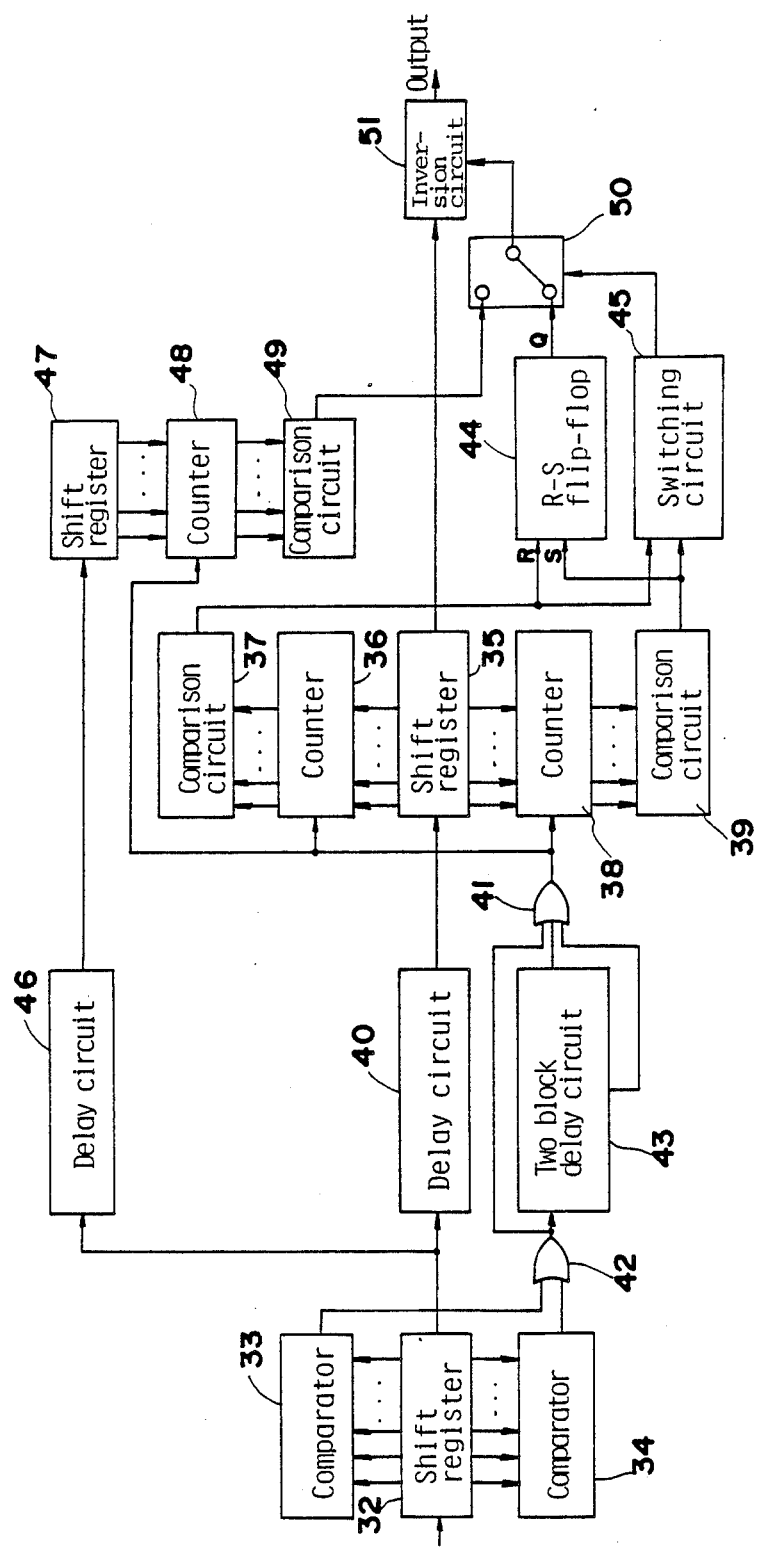
FIG. 8 is a block diagram of the decoding circuit of the data which is composed in a block and which is controlled by inversion or noninversion.

Such a decoder is elucidated referring to the block diagram of FIG. 8. The decoder as shown in FIG. 8 has three functions as will be described below.

The first function is to detect whether the synchronous pattern is inverted or not, and also whether the data which is composed in a block is decoded responding to the detected signal when the synchronous pattern is detected in a manner as with the decoder shown in FIG. 4.

The second function is to decide a position of the synchronous pattern by a protection synchronous signal from the synchronous signal protection circuit and to decode the data which is composed in the block by distinguishing which original synchronous pattern is similar to the synchronous pattern when the synchronous pattern has an error so that detection in the comparator is impossible.

The third function is to stop decoding by distinction of the synchronous pattern, and to decode the data which is composed in a block by using inversion information which is inserted by other means when the synchronous pattern has numerous error symbols.

The number of symbols in the synchronous pattern is designated by $S_s$, the number of symbols in one block is designated by $N_s$, and furthermore, and inverted synchronous pattern is designated by $\overline{S_p}$. Under the above-mentioned designation, shift register 32 in FIG. 8 has a number of stages $S_s$, comparator 33 outputs "1" only when the output of shift register 32 equals the synchronous pattern $S_p$, and comparator 34 output "1" only when the output of shift register 32 equals the synchronous pattern $\overline{S_p}$. Shift register 32 and comparators 33 and 34 are the main circuits for achieving the first function.

Shift register 35 has stages number of $S_s$, and counting circuit 36 counts a coincided number of symbols in comparison between the output of shift register 35 and synchronous pattern $S_p$ and holds them. Comparison circuit 37 outputs "1" when an output of counter 36 is X or more, and outputs "0" during a period which is shorter than one block with it is less than X. The value of X is suitable to be a minimum value which is not less than $(S_s+1)/2$.

Counter 38 counts the number of coinciding symbols in comparison between the output of shift register 35 and synchronous pattern $\overline{S_p}$ and holds the number. Comparison circuit 39 outputs "1" when the output of counter 38 is X or more, and outputs "0" during a period which is shorter than one block when it is less than X.

Furthermore, delay circuit 40, OR gates 41, 42 and two block delay circuit 43 generate signals, which show all symbols of the synchronous pattern and which exist in shift register 35. Delay circuit 40 delays the output of shift register 32 during one block. Therefore, when all symbols of the synchronous pattern of block $B_{j+1}$, which is numbered as j+1 when it exists in shift register 32, all symbols of the synchronous pattern of block $B_j$ which is preceding to block $B_{j+1}$ exist in shift register 35. At that time, a logical OR of the synchronous signals for block $B_{j+1}$, $B_j$ and $B_{j-1}$ is issued on the output of OR gate 41. It is a logical OR of the following three synchronous signals, namely, the synchronous signals which are outputs from comparators 34 and 35 for the synchronous pattern of block $B_{j+1}$, the synchronous signal which is intermediate output of 2-block delay circuit 43, which output is made by delaying an output of OR gate 42 for the synchronous pattern by one block, and the synchronous signal which is issued on the output of OR gate 42 for the synchronous pattern of block $B_{j+1}$.

Therefore, except for the case that errors exist in the synchronous pattern of three consecutive blocks or more, a point of time wherein all symbols of the synchronous pattern exist in shift register 35 can be specified. Furthermore, since the number $N_s$ of symbols of the synchronous pattern is at most 50 symbols and an error rate of the symbols is at worst $1 \times 10^{-3}$, a reliability wherein the error of the synchronous pattern arises in three consecutive blocks is very low, and hence, practicality of the present embodiment is not spoiled.

Shift register 35, counters 36 and 38, comparison circuits 37 and 39, delay circuit 40, OR gates 41 and 42 and 2-block circuit 43 are thus the main circuits for achieving the above-mentioned second function.

The output of comparator 37 is directly connected to input R of R-S flip-flop 44, and the output of comparator 39 is directly connected to input S of R-S flip-flop 44. Output Q of R-S flip-flop 44 equals to "0" when its input R is "1", and equals to "1" when its input S is "1". Also, the output of switching circuit 45 is "0" when both outputs of comparison circuits 37 and 39 are "0", and "1" in another case. The output of switching circuit 45 is held during one block.

Usually, the reliability when random errors concentrate on the synchronous pattern is very low, and the number of error symbols in the synchronized pattern is at most three symbols in the case of the random error. Therefore, it is sufficient to set the value X to be three or four in comparison circuits 37 and 39.

On the other hand, in the case of a digital VTR, a burst error is generated in trick play or due to drop out. When the burst error is generated at the head of the block and the head part is lost, a pattern which is very different from the right synchronous pattern exists at the head symbol pattern of the block i.e., at a position wherein the synchronous pattern should exist.

As mentioned above, since concentration of the random error in the synchronous pattern is very low in probability, when the difference of five or six symbols exists between patterns which exists at a position wherein synchronous patterns of the block should be and the right synchronous pattern, a burst error is deemed to have been generated. In the above-mentioned case, it makes no sence to decide which synchronous pattern of $S_p$ or $\overline{S_p}$ is analogous with this symbol pattern. Therefore, in the embodiment, the operation for detecting inversion/noninversion information of data, which is composed in a block from a synchronous pattern, is not accomplished for a synchronous pattern wherein both outputs of comparator 37 and 39 in FIG. 8 become zero. However, inversion information of symbol Im which is inserted by the circuit of FIG. 5 is detected and is decoded. Delay circuit 46, shift register 47, counter 48 and comparison circuit 49 are used for the above-mentioned process.

Timing is selected by delay circuit 46 so that all inversion and noninversion information of symbol Im are contained in shift register 47 having Im stages at a point of time wherein the output of OR gate 41 becomes zero. Counter 48 counts and a number of coinciding symbols between the data of shift register 47 at the point of time and the symbol pattern for inversion information and noninversion information, for noninverted symbol Im. Comparison circuit 49 outputs "0" when output of counter 48 is less than Im/2, and outputs "1" during one block when the output of counter 48 is Im/2 or more.

Switch 50 selects output Q of R-S flip-flop 44 when an output of switching circuit 45 is "1", and selects an output of comparison circuit 49 when the output of switching circuit 45 is "0". Hence, correctly decoded data, which is composed in a block, is issued from the output of inversion circuit 51 wherein when the outputs of shift register 35 and switch 50 are inputted.

Figure 9:
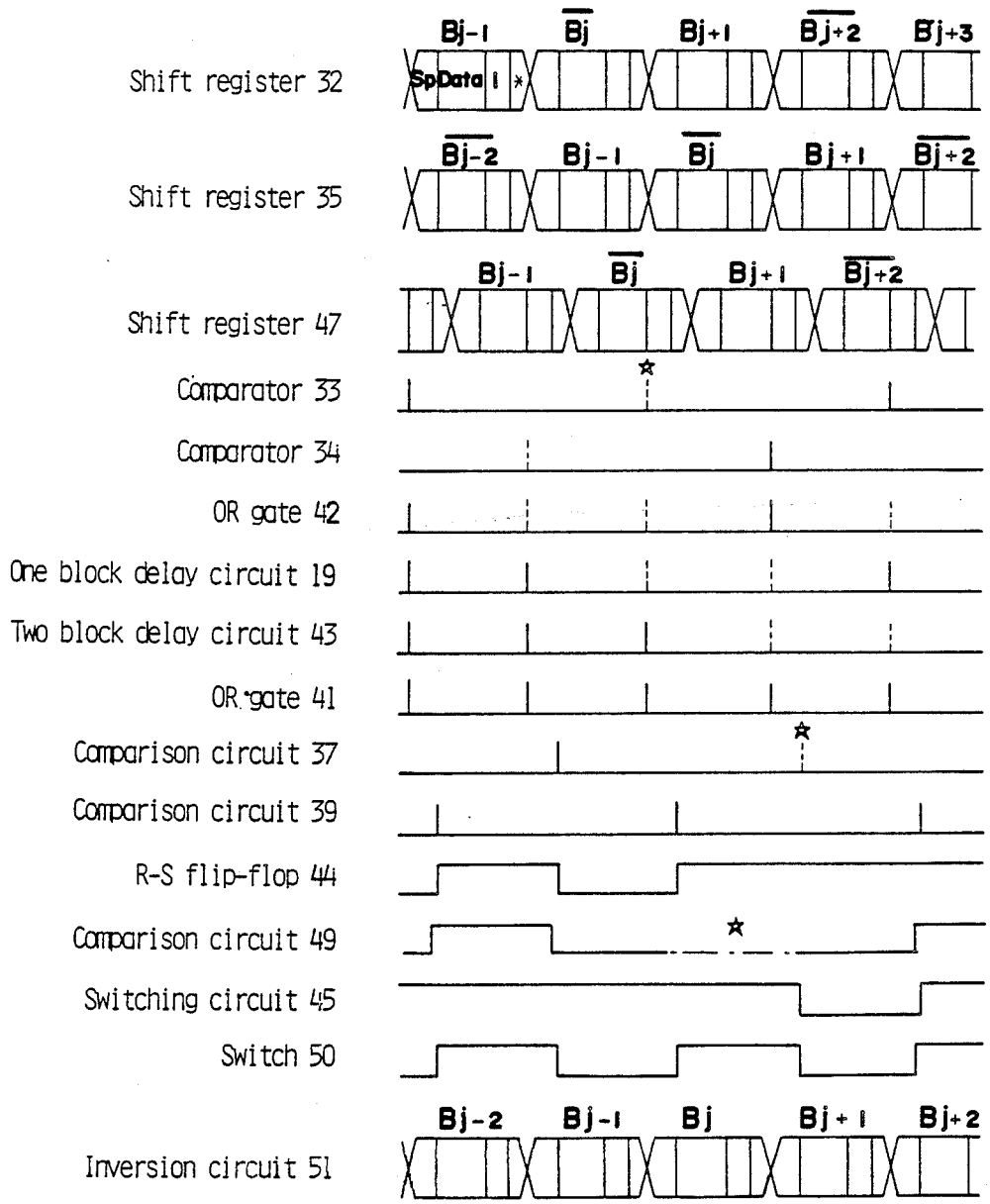
FIG. 9 is a timing chart showing operation of the circuit as shown in FIG. 8.

A timing chart showing the operation of the present embodiment as shown in FIG. 8 is shown in FIG. 9. In FIG. 9, a block numbered by j is designated by $B_j$, and a block, wherein all "2"s in the block $B_j$ are inverted, is designated by $\overline{B_j}$. Furthermore, each block is composed by a synchronous pattern $S_p$, a group of data designated as "data", inversion information I and postamble "*". Outputs of the respective shift registers 32, 35 and 47 in FIG. 8 are shown by output waveforms on the last stage of the respective shift registers. Star marks "*" in FIG. 9 designate parts which are influenced by burst error.

Correct decoding can be achieved by using the circuit as shown in FIG. 8 in spite of error in the synchronous pattern as shown in FIG. 9. Dotted lines in FIG. 9 show synchronous pulses which cannot be detected due to interference from outside, and a chain line shows a portion where the value cannot be known.

<Fourth embodiment>

This embodiment relates to a circuit for decoding an original sequence of symbols from a sequence of symbols which is replaced by the process as shown in the first embodiment, and furthermore, for decoding a sequence of bits corresponding to these symbols.

In 3B-2T code conversion in accordance with the present invention, for pairs of symbols as shown on the first line or the fifth line of Table 1, when these pairs continue, even numbered pairs of symbols are replaced by a pair of symbols as shown in the ninth line of Table 1. Therefore, the three original bits are correctly decoded by a process wherein the pair as shown in the ninth line is replaced by a pair of the last symbol in playback.

Figure 10:
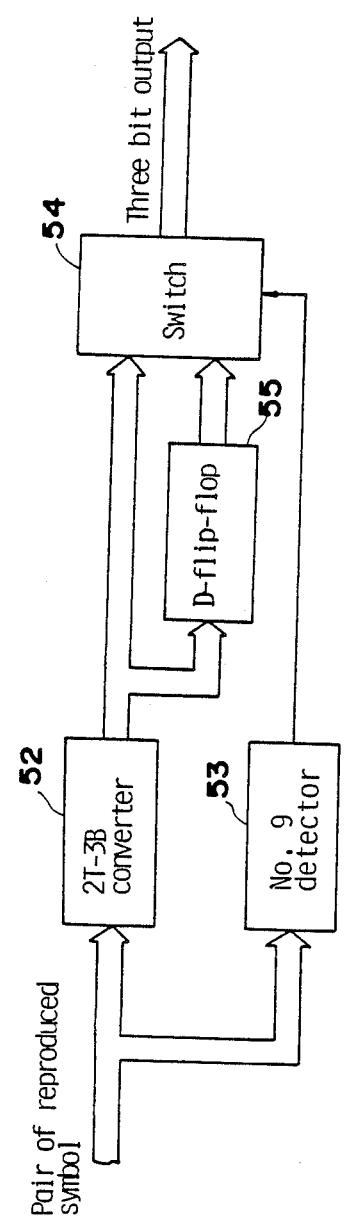
FIG. 10 is a block diagram of a circuit for decoding a replaced sequence of symbols to the original sequence of symbols.

The above-mentioned decoding is elucidated on a decoding circuit in FIG. 10. Referring to FIG. 10, a reproduced sequence of symbols is transmitted to 2T-3B converter 52 and No. 9 detector 53.

In the 2T-3B converter 52, a pair of reproduced ternary symbols $(T_1, T_2)$ is inversely converted to three binary data bits $(B_1, B_2, B_3)$ in accordance with Table 1. No. 9 detector 53 outputs "1" when the pair of reproduced ternary symbols $(T_1, T_2)$ equals to the symbol pattern of the ninth line of Table 1, and outputs "0" when the pair of reproduced ternary sumbols $(T_1, T_2)$ is not equal to the symbol pattern of the ninth line of Table 1. Switch 54 selects the output of 2T-3B converter 52 when the output of No. 9 detector 53 is "0", and selects the output of D-flip-flop 55, which holds the output which is one pair ago of 2T-3B converter, when the output of No. 9 detector 53 is "1".

Hence, the output of 2T-3B converter 52 becomes an output of the decoder if the pair of reproduced ternary symbols ($T_1$, $T_2$) is not equal to the symbol pattern of the ninth line of Table 1, and a three bit pattern corresponding to the pair of reproduced symbols which is one pair ago is selected and is decoded if the pair of reproduced ternary ($T_1$, $T_2$) is equal to a symbol pattern of the ninth line in Table 1. That is to say, the three original bits are correctly decoded, and also introduction of the ninth symbol pattern which has no one-to-one correspondence to the three bit pattern is avoided.

As to 2T-3B converter 52 in FIG. 10, when a pair of reproduced symbols is a symbol pattern of the ninth line of Table 1, the output may be freely selected by the three-bit pattern. Since two pairs of a single pattern of the ninth line in the output are not consecutively issued, it is not issued from the decoder.

Thus, as mentioned above, in the present invention the new 3B-2T code having a self-clock function is easily achieved without losing the excellent features of the conventional 3B-2T code. Moreover, 3B-2T code which does not contain a DC component is obtainable by a simple circuit. Therefore, the code in accordance with the present invention is suitable for a digital VTR, which requires the self-clock function and the code having no DC component. Furthermore, the code is freely applicable to other systems wherein high density recording is required.

As mentioned above, in the present invention, a new 3B-2T code which is superior to the conventional 3B-2T code is realized by a simple circuit, and high practical effect is obtained.

What is claimed is:

1. An apparatus for 3B-2T code conversion, comprising:

means for converting three bits of binary data ($B_1$, $B_2$, $B_3$) into a pair of ternary symbols ($T_1$, $T_2$) in one-to-one correspondence, detecting means for detecting a state in which a symbol of said pair of ternary symbols occurs at least four consecutive times for respective pairs of ternary symbols, and replacing means for replacing an even numbered pair of said ternary symbols ($T_1$, $T_2$), where ($T_1 = T_2$), by a pair of ternary symbols ($T'_1$, $T'_2$) which do not correspond to any of the three bits of binary data ($B_1$, $B_2$, $B_3$) converted by said converting means when said detecting means detects that a symbol of said pair of ternary symbols corresponding to said three bits of binary data ($B_1$, $B_2$, $B_3$) occurs at least four consecutive times for respective pairs of ternary symbols.

2. An apparatus for 3B-2T code conversion, comprising:

means for converting three bits of binary data ($B_1$, $B_2$, $B_3$) into a pair of ternary symbols ($T_1$, $T_2$) in one-to-one correspondence, detecting means for detecting a state in which a symbol of said pair of ternary symbols occurs at least four consecutive times for respective pairs of ternary symbols, and replacing means for replacing an even numbered pair of said ternary symbols ($T_1$, $T_2$), where ($T_1 = T_2$), by a pair of ternary symbols ($T'_1$, $T'_2$) which do not correspond to any of the three bits of binary data ($B_1$, $B_2$, $B_3$) converted by said converting means when said detecting means detects that a symbol of said pair of ternary symbols corresponding to said three bits of binary data ($B_1$, $B_2$, $B_3$) occurs at least four consecutive times for respective pairs of ternary symbols, counting means for counting the difference between a number N2 of symbols "2" in the output of said replacing means and a number N0 of symbols "0" when the ternary symbols are determined as (0, 1, 2), inversion control means for selecting either a first mode wherein all ternary symbols "0" and "2" are inverted to ternary symbols "2" and "0", respectively, or a second mode wherein all ternary symbols "0" and "2" are not inverted with respect to the output of said replacing means so that a difference between the number of ternary symbols "0" do not diverge in a sequence of said respective pairs of ternary symbols on the basis of the output of said counting means, and decoding means for decoding the sequence of ternary symbols controlled by said inversion control means into binary data.

3. An apparatus for 3B-2T code conversion, comprising:

means for converting three bits of binary data ($B_1$, $B_2$, $B_3$) into a pair of ternary symbols ($T_1$, $T_2$) in one-to-one correspondence, detecting means for detecting a state in which a symbol of said pair of ternary symbols occurs at least four consecutive times for respective pairs of ternary symbols, and replacing means for replacing an even numbered pair of said ternary symbols ($T_1$, $T_2$), where ($T_1 = T_2$), by a pair of ternary symbols ($T_1'$, $T_2'$) which do not correspond to any of the three bits of binary data ($B_1$, $B_2$, $B_3$) converted by said converting means when said detecting means detects that a symbol of said pair of ternary symbols corresponding to said three bits of binary data ($B_1$, $B_2$, $B_3$) occurs at least four consecutive times for respective pairs of ternary symbols, counting means for counting the difference between a number N2 of symbols "2" in the output of said replacing means and a number N0 of symbols "0" when the ternary symbols are determined as (0, 1, 2), inversion control means for selecting either a first mode wherein all ternary symbols "0" and "2" are inverted to ternary symbols "2" and "0", respectively, or a second mode wherein all ternary symbols "0" and "2" are not inverted with respect to the output of said replacing means so that a difference between the number of ternary symbols "0" do not diverge in a sequence of said respective pairs of ternary symbols on the basis of the output of said counting means, inversion information addition means for addition information for indicating inversion or noninversion to said sequence of respective pairs of ternary symbols, and decoding means for decoding the sequence of ternary symbols controlled by said inversion control means into binary data.

* * * * *